US010168380B2

(12) United States Patent
Noguchi et al.

(10) Patent No.: US 10,168,380 B2
(45) Date of Patent: Jan. 1, 2019

(54) SEMICONDUCTOR DEVICE EVALUATION JIG, SEMICONDUCTOR DEVICE EVALUATION APPARATUS, AND SEMICONDUCTOR DEVICE EVALUATION METHOD

(71) Applicant: Mitsubishi Electric Corporation, Tokyo (JP)

(72) Inventors: Takaya Noguchi, Tokyo (JP); Akira Okada, Tokyo (JP); Koichi Mochizuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 7 days.

(21) Appl. No.: 15/541,452

(22) PCT Filed: Jan. 23, 2015

(86) PCT No.: PCT/JP2015/051759
§ 371 (c)(1),
(2) Date: Jul. 3, 2017

(87) PCT Pub. No.: WO2016/117105
PCT Pub. Date: Jul. 28, 2016

(65) Prior Publication Data
US 2018/0088169 A1    Mar. 29, 2018

(51) Int. Cl.
*G01R 31/00* (2006.01)
*G01R 31/26* (2014.01)
(Continued)

(52) U.S. Cl.
CPC .......... *G01R 31/2601* (2013.01); *G01K 1/14* (2013.01); *G01K 7/00* (2013.01); *G01K 7/01* (2013.01);
(Continued)

(58) Field of Classification Search
CPC .. G01R 1/0408; G01R 1/0433; G01R 1/0483; G01R 1/07314; G01R 31/26; G01R 31/2808; G01R 31/2886
(Continued)

(56) References Cited

U.S. PATENT DOCUMENTS

2004/0164372 A1   8/2004   Akram et al.
2011/0101349 A1*  5/2011   Oda ................... G01R 31/2884
                                                        257/48
(Continued)

FOREIGN PATENT DOCUMENTS

JP    H02-075729 U1    6/1990
JP    2008-300426 A    12/2008
(Continued)

OTHER PUBLICATIONS

International Search Report issued in PCT/JP2015/051759; dated Mar. 10, 2015.

*Primary Examiner* — Jermele M Hollington
*Assistant Examiner* — Raul Rios Russo
(74) *Attorney, Agent, or Firm* — Studebaker & Brackett PC

(57) ABSTRACT

A base having electrical conductivity and a plate shape for a semiconductor device evaluation jig has a front surface which includes a mount region where a semiconductor device is to be mounted. In this mount region, the base has a through hole extending through the base. A temperature detecting element is attached to the base. An electrode pad is electrically connected to the temperature detecting element and formed in the front surface side.

20 Claims, 8 Drawing Sheets

(51) Int. Cl.
*G01R 1/04* (2006.01)
*G01K 1/14* (2006.01)
*G01K 7/00* (2006.01)
*G01K 7/01* (2006.01)
*G01K 7/16* (2006.01)

(52) U.S. Cl.
CPC ......... *G01R 1/0408* (2013.01); *G01R 1/0433* (2013.01); *G01R 1/0483* (2013.01); *G01K 2007/163* (2013.01); *G01R 31/26* (2013.01)

(58) Field of Classification Search
USPC ......... 324/71, 378, 403, 415, 425, 500, 537, 324/756.01
See application file for complete search history.

(56) References Cited

U.S. PATENT DOCUMENTS

2015/0115989 A1* 4/2015 Okada ................ G01R 31/2808
324/754.03
2016/0329304 A1* 11/2016 Hatakeyama ........... H01L 24/97

FOREIGN PATENT DOCUMENTS

| JP | 2009-094393 A | 4/2009 |
| JP | 2010-026715 A | 2/2010 |
| JP | 2012-141267 A | 7/2012 |
| JP | 2013-254873 A | 12/2013 |

* cited by examiner

SEMICONDUCTOR DEVICE EVALUATION JIG, SEMICONDUCTOR DEVICE EVALUATION APPARATUS, AND SEMICONDUCTOR DEVICE EVALUATION METHOD

TECHNICAL FIELD

The present invention relates to a semiconductor device evaluation jig, a semiconductor device evaluation apparatus, and a semiconductor device evaluation method, and particularly relates to a semiconductor device evaluation jig having a temperature detecting element for detecting the temperature of a semiconductor device, a semiconductor device evaluation apparatus, and a semiconductor device evaluation method.

BACKGROUND ART

When the electrical characteristic of a semiconductor device which is an object to be measured is evaluated, it is important to precisely measure the temperature of the semiconductor device under evaluation. Particularly regarding evaluation of a temperature characteristic, unstable measurement of the temperature of the semiconductor device under evaluation results in an error in the temperature characteristic itself. Moreover, when the electrical characteristic is evaluated in order to address the requirement to apply large current/high voltage, the temperature of the semiconductor device may vary due to the application of large current/high voltage. In this case, it is also important to measure the temperature variation of the semiconductor device together with the electrical characteristic.

Under such circumstances, contact-type and non-contact type methods are known as methods for measuring the temperature of a semiconductor device. For example, in the case of the contact-type method, a thermocouple is placed in direct contact with the surface of the semiconductor device to measure the surface temperature of the semiconductor device. This method, however, is accompanied by movement of heat due to the contact and therefore does not accurately measure the temperature of the semiconductor device itself. In the case of the non-contact type method, an optical radiation thermometer may be used to measure the temperature. However, when the surface of the semiconductor device is a mirror surface, the temperature is difficult to measure. Even when the temperature can be measured, the detected temperature is easily variable depending on the setting of the emittance. Therefore, this type of method does not accurately measure the temperature of the semiconductor device.

A method for evaluating the temperature of an object to be measured is disclosed for example in Japanese Patent Laying-Open No. 2010-26715 (see PTD 1) and Japanese Patent Laying-Open No. 2013-254873 (see PTD 2).

According to Japanese Patent Laying-Open No. 2010-26715, a temperature sensor is placed on a resin table on which an object to be measured is to be mounted, and the temperature in a bath is controlled based on the temperature measured by this temperature sensor. According to Japanese Patent Laying-Open No. 2013-254873, a thermistor with leads is placed in a power module and this thermistor is used to measure the temperature of a semiconductor device.

CITATION LIST

Patent Document

PTD 1: Japanese Patent Laying-Open No. 2010-26715
PTD 2: Japanese Patent Laying-Open No. 2013-254873

SUMMARY OF INVENTION

Technical Problem

The temperature sensor in Japanese Patent Laying-Open No. 2010-26715, however, is mounted on the resin table and located away from the object to be measured. It is therefore impossible to precisely detect the temperature of the object itself.

The thermistor in Japanese Patent Laying-Open No. 2013-254873 measures the temperature of the semiconductor device through an air layer. It is therefore impossible to precisely detect the temperature of the semiconductor device itself.

The present invention has been made in view of the above-described problems to provide a semiconductor device evaluation jig, a semiconductor device evaluation apparatus, and a semiconductor device evaluation method that can precisely measure the temperature of a semiconductor device in evaluating the semiconductor device.

Solution to Problem

A semiconductor device evaluation jig of the present invention is used with a semiconductor device evaluation apparatus for evaluating an electrical characteristic of a semiconductor device, and the semiconductor device evaluation jig in use is disposed on a stage of the semiconductor device evaluation apparatus. The semiconductor device evaluation jig includes a base having electrical conductivity and a plate shape, at least one temperature detecting element, and a first electrode pad. The electrically conductive and plate-shaped base has a first surface and a second surface opposite to the first surface, the base has, in the first surface, a mount region where the semiconductor device is to be mounted, and the base has a through hole located in the mount region and extending through from the first surface to the second surface. The at least one temperature detecting element is attached to the base. The first electrode pad is electrically connected to the temperature detecting element and formed in the first surface side.

Advantageous Effects of Invention

In accordance with the present invention, the through hole is formed in the base, and therefore, the semiconductor device can be secured to and in close contact with the base by vacuum suction from the stage. Accordingly, the temperature of the semiconductor device can be detected by the temperature detecting element through the electrically conductive base, and thus the temperature of the semiconductor device can precisely be detected.

Moreover, the first electrode pad which is electrically connected to the temperature detecting element is formed in the first surface side. Accordingly, use of the semiconductor device evaluation jig of the present invention enables use of an existing semiconductor device evaluation apparatus and thereby enables precise detection of the temperature of the semiconductor device in the above-described manner. A new semiconductor device evaluation apparatus is thus unnecessary to prepare.

DESCRIPTION OF EMBODIMENTS

In the following, embodiments of the present invention will be described based on the drawings.

First Embodiment

Initially, a configuration of a semiconductor device evaluation apparatus in the present embodiment will be described with reference to FIG. 1.

Figure 1:
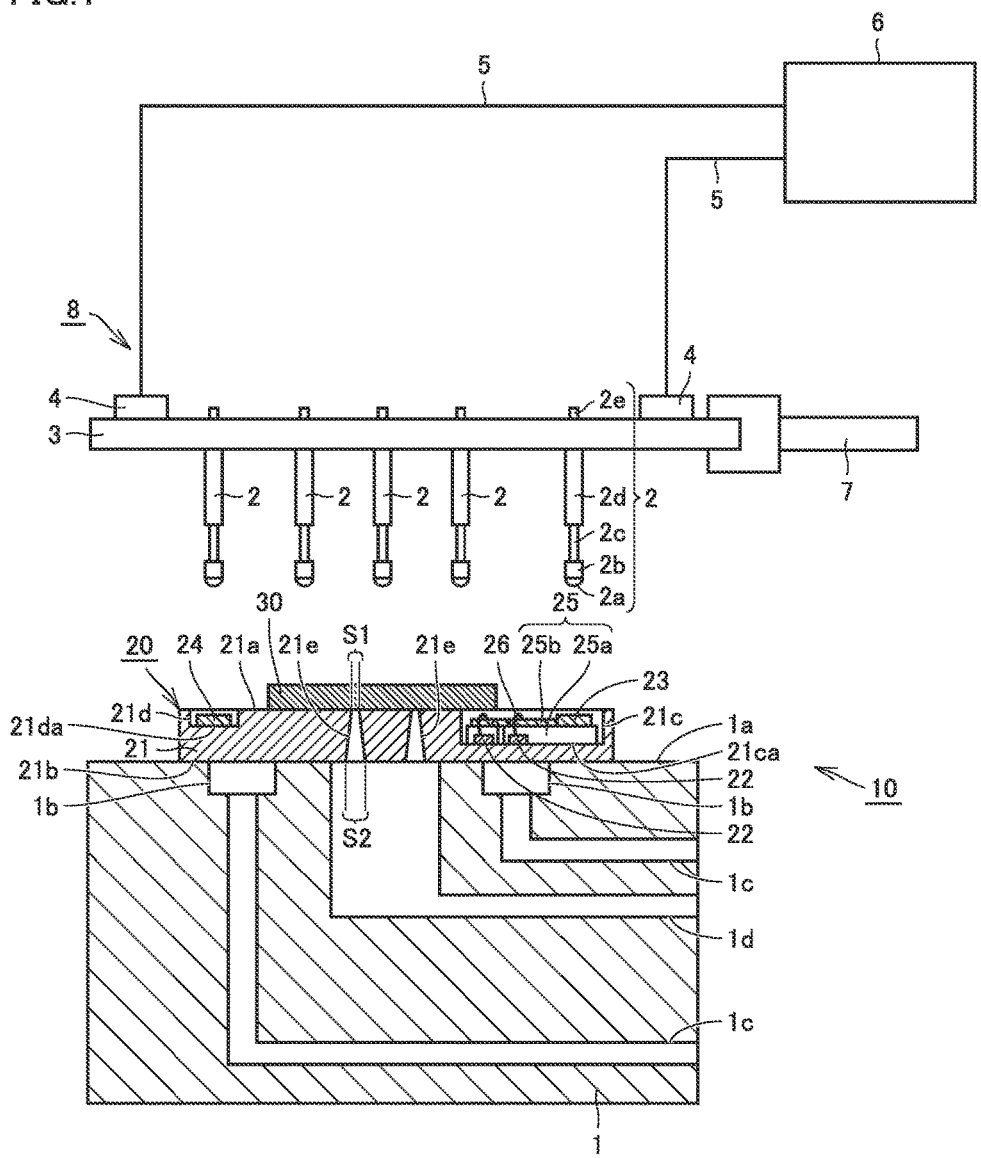
FIG. 1 is a diagram schematically showing a configuration of a semiconductor device evaluation apparatus in a first embodiment of the present invention.

FIG. 1 is a diagram schematically showing the configuration of the semiconductor device evaluation apparatus in the present embodiment. As shown in FIG. 1, semiconductor device evaluation apparatus 10 mainly includes a chuck stage (stage) 1, a plurality of contact probes (probes) 2, an insulating base (insulating support member) 3, a connecting portion 4, a signal line 5, an evaluation unit (control unit) 6, a moving arm 7, and a semiconductor device evaluation jig 20.

Chuck stage 1 is a table having a surface 1a, and semiconductor device evaluation jig 20 is set in contact with and secured to surface 1a. Chuck stage 1 is configured to be capable of securing semiconductor device evaluation jig 20 as well as a semiconductor device 30 by vacuum suction.

Specifically, in chuck stage 1, a suction groove 1b and suction holes 1c, 1d are formed. Suction groove 1b is formed in surface 1a of chuck stage 1. Suction hole 1c is formed in chuck stage 1 and connecting to the bottom of suction groove 1b. Suction hole 1d extends through chuck stage 1 to reach surface 1a of chuck stage 1 and open at surface 1a. To each of suction holes 1c, 1d, an exhaust device (not shown) such as vacuum pump is connected.

Semiconductor device evaluation jig 20 is mounted on surface 1a of chuck stage 1. Semiconductor device evaluation jig 20 covers respective openings of suction groove 1b and suction hole 1d. When semiconductor device 30 is evaluated, semiconductor device evaluation jig 20 is vacuum-sucked to chuck stage 1. Moreover, when semiconductor device 30 is evaluated, semiconductor device 30 which is an object to be measured is mounted on semiconductor device evaluation jig 20. Details of the configuration of semiconductor device evaluation jig 20 will be described later herein.

A plurality of contact probes 2 are supported by insulating base 3. A plurality of contact probes 2 each include a contact portion 2a, a tip portion 2b, a pushed-in portion 2c, an insulating base mount portion 2d, and an electrically-connecting portion 2e.

Contact portion 2a is provided on the leading end of tip portion 2b. Contact portion 2a is a portion to be mechanically and electrically connected to an electrode pad (first electrode pad) 23 of semiconductor device evaluation jig 20, an electrode pad (second electrode pad) 24 thereof, and a surface pad of semiconductor device 30. Pushed-in portion 2c has one end connected to tip portion 2b and the other end partially inserted in insulating base mount portion 2d.

Insulating base mount portion 2d is formed as a pedestal and connected to insulating base 3. In insulating base mount portion 2d, an elastic member such as spring member (not shown) is incorporated. Pushed-in portion 2c is biased toward tip portion 2b away from insulating base mount portion 2d by the spring member in insulating base mount portion 2d.

Accordingly, in the state where contact portion 2a of contact probe 2 is not in contact with the surface of the object to be measured, pushed-in portion 2c has been moved in the direction of tip portion 2b away from insulating base mount portion 2d, and thus contact probe 2 has been extended to the maximum extent. In the state where contact portion 2a of contact probe 2 is in contact with the surface of the object to be measured, pushed-in portion 2c has been pushed in by a predetermined extent into insulating base mount portion 2d against the biasing force of the spring member. In this way, pushed-in portion 2c is slidable with respect to insulating base mount portion 2d.

Electrically-connecting portion 2e of contact probe 2 electrically communicates with tip portion 2b and serves as an output end for the outside.

While each contact probe 2 is made of a material (metal material, alloy material) which is a single electrically conductive material or any combination thereof such as copper, tungsten, rhenium tungsten or the like, contact probe 2 is not limited to them. In particular, for the sake of improvement of electrical conductivity and improvement of durability for example, contact portion 2a may be a portion covered with a different material from the above-described ones, namely a single metal material such as gold, palladium, tantalum, platinum, or the like, or an alloy material formed of any combination thereof.

It is assumed that large current is applied, and accordingly a plurality of contact probes 2 are mounted for each semiconductor device 30. A plurality of contact probes 2 are each electrically connected to connecting portion 4.

Connecting portion 4 is formed on insulating base 3. Each contact probe 2 and connecting portion 4 are electrically connected to each other by a metal plate (not shown) provided on insulating base 3, for example. A plurality of contact probes 2, insulating base 3, and connecting portion 4 constitute a probe base 8.

Signal line 5 is electrically connected through connecting portion 4 to each of a plurality of contact probes 2. Evaluation unit 6 is electrically connected through signal line 5 and connecting portion 4 to each of a plurality of contact probes 2. Evaluation unit 6 has a function of evaluating an electrical characteristic of semiconductor device 30 which is an object to be measured.

Moving arm 7 is configured to be capable of moving probe base 8 in any direction. In the present embodiment, probe base 8 is configured to be held by a single moving arm 7 only. Probe base 8, however, is not limited to this, and may be stably held by a plurality of moving arms. Alternatively, semiconductor device 30, namely chuck stage 1 may be moved, instead of moving probe base 8 by moving arm 7.

Next, a configuration of semiconductor device evaluation jig 20 in the present embodiment will be described with reference to FIGS. 1 and 2.

Figure 2:
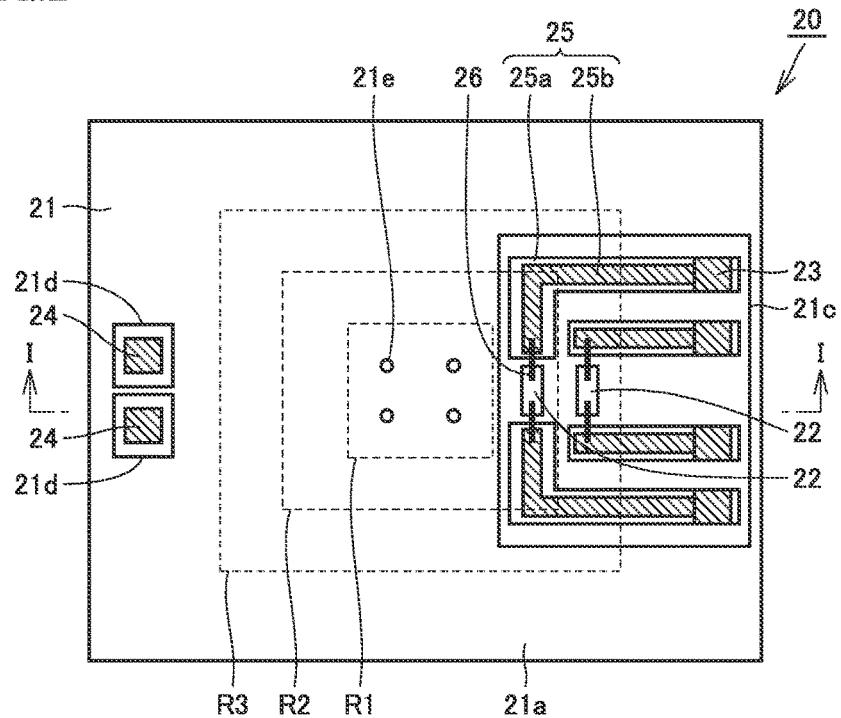
FIG. 2 is a plan view schematically showing a configuration of a semiconductor device evaluation jig in the first embodiment of the present invention.

FIG. 2 is a plan view schematically showing the configuration of the semiconductor device evaluation jig in the present embodiment. The configuration of the cross section along line I-I in FIG. 2 corresponds to the cross-sectional configuration of semiconductor device evaluation jig 20 shown in FIG. 1.

As shown in FIGS. 1 and 2, semiconductor device evaluation jig 20 in the present embodiment is provided for the purpose of precisely detecting the temperature of semiconductor device 30 in evaluating an electrical characteristic of semiconductor device 30. Semiconductor device evaluation jig 20 is used with the above-described semiconductor device evaluation apparatus 10 and disposed between chuck stage 1 of semiconductor device evaluation apparatus 10 and semiconductor device 30 which is an object to be measured.

Specifically, base 21 has a front surface (first surface) 21a and a back surface (second surface) 21b opposite to the front surface. Front surface 21a of base 21 is a surface on which semiconductor device 30 is to be mounted. Back surface 21b of base 21 is a surface to be brought into contact with surface 1a of chuck stage 1. Semiconductor device evaluation jig 20 in use is disposed on chuck stage 1.

Semiconductor device evaluation jig 20 mainly includes base 21, at least one (two, for example) temperature detecting element(s) 22, electrode pads 23, 24, and an interconnecting portion 25.

Base 21 is electrically conductive and made of a single metal material such as copper or aluminum for example, or an alloy material which is a combination of any of these metal materials. Base 21, however, is not limited to them. Moreover, base 21 has a plate shape. The shape in plan view of base 21 is adapted to the shape in plan view of semiconductor device 30 to be evaluated. While the shape in plan view of base 21 is a quadrilateral shape, for example, the shape is not limited to the quadrilateral shape. "Shape in plan view" herein means the shape as seen in the direction perpendicular to front surface 21a of base 21 (as seen in plan view).

Base 21 has, in its surface 21a, mount regions R1, R2, R3 (the regions indicated by the broken lines in FIG. 2) where semiconductor device 30 is to be mounted. Mount regions R1, R2, R3 are each an example of the region on which semiconductor device 30 is supposed to be mounted.

Mount region R1 represents a mount region for semiconductor device 30 whose shape in plan view is smaller, and mount region R3 represents a mount region for semiconductor device 30 whose shape in plan view is larger. Mount region R2 represents a mount region for semiconductor device 30 whose shape in plan view is intermediate in size between mount region R1 and mount region R3.

Base 21 has at least one (four for example) through hole(s) 21e. Through hole 21e extends through base 21 from its front surface 21a to its back surface 21b. Through hole 21e is located in the vicinity of the center of front surface 21a of base 21.

The center of front surface 21a of base 21 is the intersection of diagonal lines in the case where the shape in plan view of base 21 is a quadrilateral shape, or the center of a circle in the case where the shape in plan view of base 21 is a circular shape. The fact that through hole 21e is located in the vicinity of the center of front surface 21a of base 21 means that through hole 21e is located within mount region R1 having the smallest shape in plan view for an object supposed to be measured.

Through hole 21e is located in the vicinity of the center of front surface 21a so as to be adaptable to semiconductor devices 30 of various sizes. In this way, even a small semiconductor device 30 can be mounted on front surface 21a of semiconductor device evaluation jig 20 to cover through hole 21e. Therefore, even a small semiconductor device 30 can be secured by vacuum suction to chuck stage 1 and semiconductor device evaluation jig 20.

Through hole 21e has a tapered shape with its opening area S2 at back surface 21b larger than its opening area S1 at front surface 21a. Namely, through hole 21e is formed so that the area gradually increases from front surface 21a toward back surface 21b.

Base 21 has a recess (first electrode pad recess) 21c and a recess (second electrode pad recess) 21d in front surface 21a. Recesses 21c, 21d have respective bottoms 21ca, 21da each located at a predetermined depth from front surface 21a. Each of recesses 21c, 21d is a counterbore, for example.

Preferably, respective bottoms 21ca, 21da of recesses 21c, 21d each have a flat surface without burr or projection. Since each of bottoms 21ca, 21da has the flat surface, damage to the mount surface of an object which is mounted in recess 21c, 21d is suppressed. Flat bottoms 21ca, 21da can be formed by cleaning and/or polishing.

In the case where base 21 is a metal material, base 21 can be produced by counterboring for forming recesses 21c, 21d and machining for forming through hole 21e. In the case where base 21 is an electrically conductive resin material, base 21 can be produced by molding.

In recess 21c, temperature detecting element 22, electrode pad 23, and interconnecting portion 25 are disposed. In recess 21d, electrode pad 24 is disposed. These temperature detecting element 22, electrode pads 23, 24, and interconnecting portion 25 are disposed in the front surface 21a side of base 21.

Temperature detecting element 22 measures the temperature of semiconductor device 30 in evaluating the electrical characteristic of semiconductor device 30. Temperature detecting element 22 is a diode, for example. Temperature detecting element 22 is mounted by die bonding for example onto bottom 21ca of recess 21c and thereby attached to base 21.

In the present embodiment, an example is illustrated where two temperature detecting elements 22 are arranged in parallel. The arrangement of temperature detecting elements 22, however, is not limited to this. In front surface 21a of base 21, a plurality of temperature detecting elements 22 may be arranged in a line in the direction from the center to the edge. In this way, regardless of the size of the shape in plan view of semiconductor device 30, the temperature of semiconductor device 30 can be precisely detected. Moreover, since a plurality of temperature detecting elements 22 are mounted, whether or not the temperature is uniformly distributed can easily be confirmed. Details of the configuration of temperature detecting element 22 will be described later herein.

Interconnecting portion 25 includes a base member 25a and an interconnection 25b. Base member 25a is attached, by adhesion or the like, to bottom 21ca of recess 21c. Base member 25a is made for example of a ceramic material. Since the ceramic material has high thermal conductivity, the temperature of semiconductor device evaluation jig 20 as well as semiconductor device 30 can be made uniform in a short time.

The material for base member 25a is not limited to the ceramic material. Base member 25a may be a resin which is of low cost and easy to process, or a flexible substrate (substrate having flexibility) which has a thin thickness and high degree of freedom in shape.

On the surface of base member 25a, interconnection 25b and electrode pad 23 are formed. Interconnection 25b and electrode pad 23 are each formed by depositing electrically conductive copper or aluminum on the surface of base member 25a and thereafter pattering it. Electrode pad 23 is a part for electrically connecting contact probe 2 to temperature detecting element 22. Interconnection 25b and a surface pad of semiconductor device 30 are electrically connected to each other by a connection wire 26.

In recess 21d, electrode pad 24 is formed. Electrode pad 24 is a part for electrically connecting contact probe 2 to base 21. Electrode pad 24 is formed to be electrically connected to base 21. Since base 21 is electrically conductive, connection of contact probe 2 to electrode pad 24 enables electrical connection of contact probe 2 to an electrode of the back surface of semiconductor device 30. Electrode pad 24 may be made of the same material as base 21 and integrated with base 21, or may be made of a material different from base 21.

While the present embodiment has been described in connection with the case where two electrode pads 24 are provided in order to be adaptable to large current, the number of electrode pads 24 is not limited to two and may be three or more. Moreover, respective parts (two electrode pads 24 shown in FIG. 2 for example) to which a plurality of contact probes 2 are connected may be joined together into one electrode pad to thereby increase the electrode area.

As shown in FIG. 1, electrode pad 23, base member 25a, interconnection 25b, and connection wire 26 are each disposed within recess 21c, and do not protrude to a higher level (toward the location where semiconductor device 30 is mounted) than the position of the height of front surface 21a of base 21. Electrode pad 24 is disposed within recess 21d and does not protrude to a higher level than the position of the height of front surface 21a of base 21.

As shown in FIG. 2, the temperature detecting elements are disposed directly below mount regions R2 and R3. As seen in plan view, electrode pad 23 is located at a shorter distance from the edge of front surface 21a of base 21, relative to the distance from the edge to temperature detecting element 22. Specifically, at the center of front surface 21a of base 21, through hole 21e is located. Temperature detecting element 22 is located at a shorter distance from the edge of base 21 relative to the distance from the edge to through hole 21e, and electrode pad 23 is located at a shorter distance from the edge of base 21 relative to the distance from the edge to temperature detecting element 22. Electrode pad 24 is disposed at the opposite edge of front surface 21a of base 21 that is opposite to electrode pad 23, with through hole 21e located between electrode pads 23 and 24.

Next, a configuration of temperature detecting element 22 in the present embodiment will be described with reference to FIG. 3.

Figure 3:
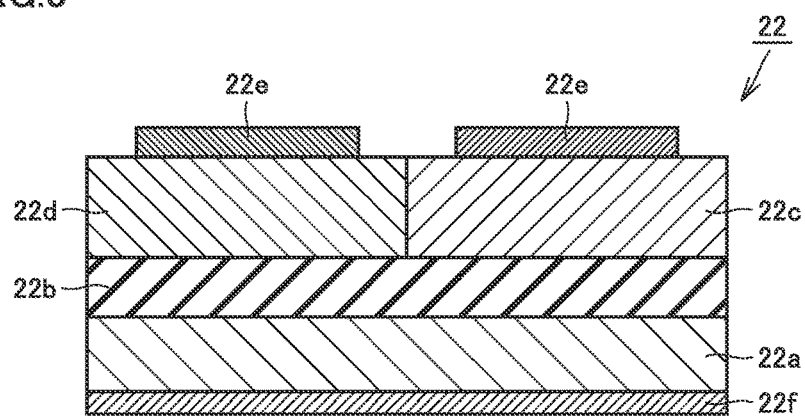
FIG. 3 is a cross-sectional view schematically showing a configuration of a temperature detecting element used with the semiconductor device evaluation jig in FIG. 2.

FIG. 3 is a cross-sectional view schematically showing the configuration of the temperature detecting element used with the semiconductor device evaluation jig in FIG. 2. As shown in FIG. 3, temperature detecting element 22 is a diode for example, and includes a single crystal silicon layer 22a, an insulating layer 22b, an n-type polycrystalline silicon layer 22c, a p-type polycrystalline silicon layer 22d, an electrode pad 22e, and a metal electrode 22f.

Above single crystal silicon layer 22a, n-type polycrystalline silicon layer 22c and p-type polycrystalline silicon layer 22d are formed with insulating layer 22b interposed therebetween. Insulating layer 22b is a silicon oxide film, for example. N-type polycrystalline silicon layer 22c and p-type polycrystalline silicon layer 22d are formed next to each other. A pn junction between n-type polycrystalline silicon layer 22c and p-type polycrystalline silicon layer 22d forms a diode. To n-type polycrystalline silicon layer 22c and p-type polycrystalline silicon layer 22d, respective electrode pads 22e are connected. Metal electrode 22f is formed in contact with single crystal silicon layer 22a.

Metal electrode 22f is attached, by die bonding for example, to bottom 21ca of recess 21c of base 21 shown in FIG. 1. Electrode pad 22e is electrically connected through connection wire 26 to interconnection 25b shown in FIG. 1. Thus, contact probe 2 can be placed in contact with electrode pad 23 to thereby electrically connect contact probe 2 to temperature detecting element 22 through interconnecting portion 25.

In the present embodiment, a chip-type diode element formed of polycrystalline silicon and the like as described above is supposed to be used as temperature detecting element 22. Temperature detecting element 22, however, is not limited to such a chip-type diode, and may alternatively be a surface-mount type package, for example. In this case, temperature detecting element 22 may be directly connected with solder or the like to an end of interconnection 25b without connection wire 26 therebetween.

Next, a description will be given, with reference to FIG. 4, of an example of the configuration of semiconductor device 30 which is an object to be measured by semiconductor device evaluation apparatus 10 in the present embodiment.

Figure 4:
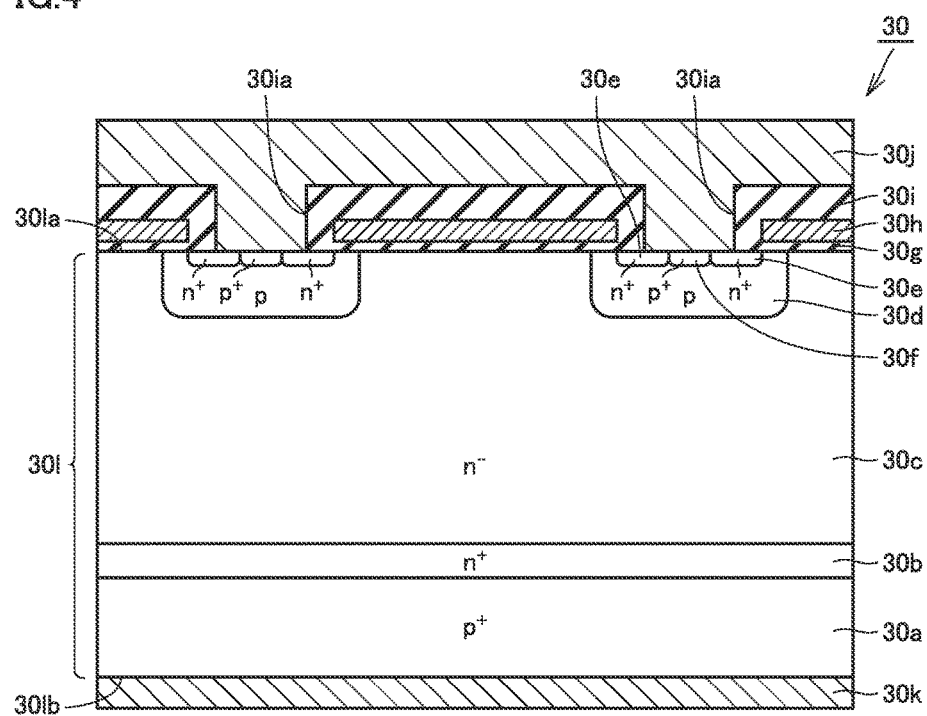
FIG. 4 is a cross-sectional view schematically showing a configuration of a semiconductor device to be evaluated by the semiconductor device evaluation apparatus shown in FIG. 1.

FIG. 4 is a cross-sectional view schematically showing the configuration of the semiconductor device to be evaluated by the semiconductor device evaluation apparatus shown in FIG. 1. As shown in FIG. 4, semiconductor device 30 is a vertical IGBT (Insulated Gate Bipolar Transistor) having a planar gate structure, for example.

Semiconductor device 30 chiefly includes a $p^+$ collector region 30a, an $n^+$ region 30b, an $n^-$ region 30c, a p-type base region 30d, an $n^+$ emitter region 30e, a $p^+$ contact region 30f, a gate insulating layer 30g, a gate electrode layer 30h, an interlayer insulating layer 30i, an emitter electrode 30j, and a collector electrode 30k.

In semiconductor substrate 30*l* having one surface 30*la* and the other surface 30*lb* opposite to one surface 30*la*, p$^+$ collector region 30*a*, n$^+$ region 30*b*, n$^-$ region 30*c*, p-type base region 30*d*, n$^+$ emitter region 30*e*, and p$^+$ contact region 30*f* are formed.

On the other surface 30*lb* of semiconductor substrate 30*l*, p$^+$ collector region 30*a* is formed. On the one surface 30*la* side of p$^+$ collector region 30*a*, n$^-$ region 30*c* is formed with n$^+$ region 30*b* interposed therebetween. In n$^-$ region 30*c*, p-type base region 30*d* is selectively formed under one surface 30*la*. In p-type base region 30*d*, n$^+$ emitter region 30*e* and p$^+$ contact region 30*f* are formed next to each other under one surface 30*la*.

On p-type base region 30*d* located between n$^+$ emitter region 30*e* and n$^-$ region 30*c*, gate electrode layer 30*h* is formed with gate insulating layer 30*g* interposed therebetween. N$^+$ emitter region 30*e*, n$^-$ region 30*c*, p-type base region 30*d*, gate insulating layer 30*g*, and gate electrode layer 30*h* form an insulated-gate field effect transistor.

Interlayer insulating layer 30*i* is formed on one surface 30*la* of semiconductor substrate 30*l* to cover gate electrode layer 30*h*. In interlayer insulating layer 30*i*, a contact hole 30*ia* is formed to reach n$^+$ emitter region 30*e* and p$^+$ contact region 30*f*.

Emitter electrode 30*j* is formed on interlayer insulating layer 30*i* to be electrically connected, through contact hole 30*ia*, to n$^+$ emitter region 30*e* and p$^+$ contact region 30*f*. On the other surface 30*lb* of semiconductor substrate 30*l*, collector electrode 30*k* is formed to be electrically connected to p$^+$ collector region 30*a*.

While semiconductor device 30 described above is a vertical IGBT having a planar gate structure, semiconductor device 30 is not limited to this. Semiconductor device 30 may for example be a vertical MIS (Metal Insulator Semiconductor) transistor having a planar gate structure, or a vertical IGBT or MIS transistor having a trench gate structure.

Alternatively, semiconductor device 30 may be a lateral device, namely semiconductor device 30 with its input and output accomplished through only one side of the semiconductor device (such as lateral IGBT or MIS transistor having a planar gate structure, or lateral IGBT or MIS transistor having a trench gate structure).

In evaluating the electrical characteristic of vertical semiconductor device 30 as shown in FIG. 4, collector electrode 30*k* is electrically connected to conductive base 21 and electrically connected to contact probe 2 through electrode pad 24 of base 21.

Semiconductor device 30 has surface pads electrically connected to respective emitter electrode 30*j* and gate electrode layer 30*h*. To each surface pad, corresponding contact probe 2 is directly connected, so that contact probes 2 are electrically connected to respective emitter electrode 30*j* and gate electrode layer 30*h*.

Next, a semiconductor device evaluation method in the present embodiment will be described with reference to FIGS. 1, 4, and 5.

Referring to FIG. 1, before evaluation of the electrical characteristic of semiconductor device 30, initially semiconductor device evaluation jig 20 is mounted on surface 1*a* of chuck stage 1. At this time, back surface 21*b* of base 21 is brought into contact with surface 1*a* of chuck stage 1. Moreover, on the opening, at surface 1*a*, of suction hole 1*d* in chuck stage 1, through hole 21*e* of base 21 is located, and thus suction hole 1*d* communicates with through hole 21*e*.

Semiconductor device 30 is mounted on semiconductor device evaluation jig 20. At this time, semiconductor device 30 covers through hole 21*e* of base 21. Moreover, collector electrode 30*k* of semiconductor device 30 shown in FIG. 4 is brought into contact with front surface 21*a* of base 21.

Semiconductor device evaluation jig 20 and semiconductor device 30 are secured by vacuum suction to surface 1*a* of chuck stage 1. Specifically, vacuum suction through suction hole 1*c* and suction groove 1*b* causes semiconductor device evaluation jig 20 to be secured to surface 1*a* of chuck stage 1. Moreover, vacuum suction through suction hole 1*d* and through hole 21*e* causes semiconductor device 30 to be secured to surface 1*a* of chuck stage 1 through semiconductor device evaluation jig 20. This vacuum suction causes the back surface (collector electrode 30*k*) of semiconductor device 30 to be in close contact with front surface 21*a* of base 21.

After this, moving arm 7 is used to move probe base 8. Movement of moving arm 7 causes probe base 8 to move (descend) toward semiconductor device 30 and semiconductor device evaluation jig 20.

Figure 5:
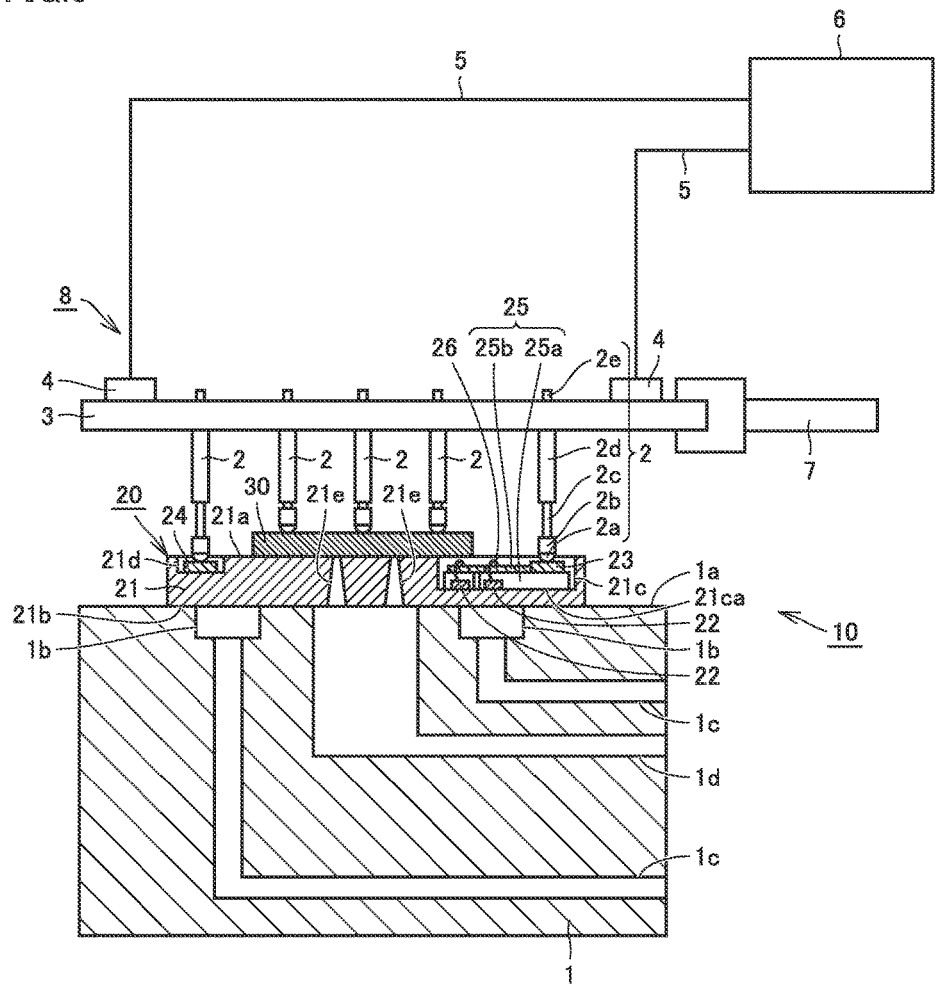
FIG. 5 is a diagram schematically showing a manner of evaluating a semiconductor device with the semiconductor device evaluation apparatus shown in FIG. 1.

As shown in FIG. 5, the movement of probe base 8 causes a plurality of contact probes 2 to be connected to respective corresponding electrode pads 23, 24 and surface pads of semiconductor device 30. In this state, current/voltage is applied from a plurality of contact probes 2 to semiconductor device 30. Thus, evaluation on the electrical characteristic of semiconductor device 30 is conducted. Moreover, temperature detecting element 22 detects the temperature of semiconductor device 30.

After the evaluation is completed, contact probes 2 are separated from electrode pads 23, 24 and the surface pads of semiconductor device 30. Semiconductor device 30 is thereafter removed from semiconductor device evaluation jig 20, and another semiconductor device 30 is newly mounted on semiconductor device evaluation jig 20 to continue the evaluation.

In the case where a plurality of semiconductor devices 30 are mounted on one semiconductor device evaluation jig 20, all the semiconductor devices 30 mounted on semiconductor device evaluation jig 20 are evaluated and thereafter removed, and thereafter another plurality of semiconductor devices 30 are newly mounted on semiconductor device evaluation jig 20 to continue the evaluation.

Next, an operation of the contact probes of semiconductor device evaluation apparatus 10 in the present embodiment will be described with reference to FIG. 6 (A) to FIG. 6 (C).

Figure 6:
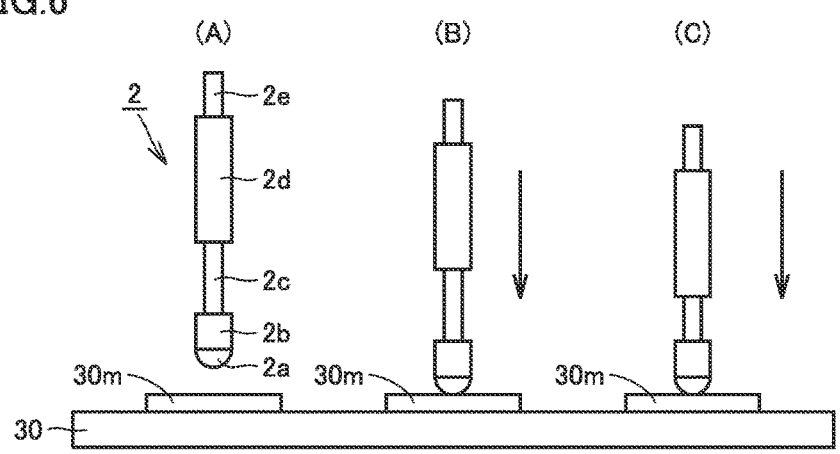
FIG. 6 is a schematic diagram for illustrating an operation of a contact probe used in the first embodiment of the present invention.

FIG. 6 (A) to FIG. 6 (C) show a schematic diagram for illustrating the operation of contact probe 2. As shown in FIG. 6 (A), in an initial state, pushed-in portion 2*c* of contact probe 2 is biased toward tip portion 2*b* by a spring member (not shown) in insulating base mount portion 2*d*. Thus, contact probe 2 has been extended to the maximum extent.

As shown in FIG. 6 (B), for evaluation after the initial state, contact probe 2 is moved down toward semiconductor device 30. When the contact probe has descended by a predetermined extent, contact portion 2*a* of contact probe 2 touches surface pad 30*m* on the top surface of semiconductor device 30.

As shown in FIG. 6 (C), contact probe 2 is thereafter moved down further toward semiconductor device 30. Then, pushed-in portion 2*c* is pushed into insulating base mount portion 2*d* against the biasing force of the spring member in insulating base mount portion 2*d*. In this way, contact between contact probe 2 and surface pad 30*m* of semiconductor device 30 is ensured.

While contact probe 2 described above is of spring type and axially slidable, the contact probe is not limited to this, and may be a contact probe of cantilever type. Axially slidable contact probe 2 is not limited to the spring type and may be a multilayer probe, wire probe, or the like.

Next, functions and effects of the present embodiment will be described.

In accordance with the present embodiment, through hole 21e is formed in base 21 of semiconductor device evaluation jig 20 as shown in FIG. 1. Therefore, semiconductor device 30 can be secured to and in close contact with electrically conductive base 21 by vacuum suction applied from chuck stage 1 through the through hole 21e. Since the semiconductor device is secured to and in close contact with base 21, the electrical resistance component is reduced, which improves the precision of the temperature detection.

Further, base 21 is electrically conductive and therefore high in thermal conductivity. To this base 21, temperature detecting element 22 is attached. Accordingly, semiconductor device 30 is connected to temperature detecting element 22 through base 21 having high thermal conductivity, without an air layer between them. The temperature of semiconductor device 30 can therefore be detected precisely by temperature detecting element 22.

Further, electrode pad 23 electrically connected to temperature detecting element 22 is formed in the front surface 21a side of base 21. Therefore, in evaluating the electrical characteristic of semiconductor device 30 as shown in FIG. 4, contact probe 2 can also be connected to temperature detecting element 22. Accordingly, use of semiconductor device evaluation jig 20 of the present embodiment enables any existing semiconductor device evaluation apparatus 10 to be used to precisely detect, at low cost, the temperature of semiconductor device 30 in the above-described manner. It is therefore unnecessary to prepare a new semiconductor device evaluation apparatus.

Further, use of semiconductor device evaluation jig 20 also enables any existing semiconductor device evaluation apparatus 10 to be used and further enables semiconductor device evaluation apparatus 10 to adapt to semiconductor devices 30 of different sizes. It is therefore unnecessary to prepare a variety of different semiconductor device evaluation jigs 20, which produces the effect of reducing the cost.

Further, as shown in FIG. 1, electrode pad 24 which is electrically connected to base 21 is formed in the front surface 21a side of base 21. Therefore, even when a vertical device as shown in FIG. 4 for example is used as semiconductor device 30, contact probe 2 can be electrically connected to a back-side electrode (collector electrode 30k for example) of the device, through base 21 and electrode pad 24.

Further, as shown in FIG. 1, in the front surface 21a side of base 21, temperature detecting element 22 is attached to base 21. Accordingly, temperature detecting element 22, electrode pads 23, 24, interconnecting portion 25, and connection wire 26 can be concentrated in the front surface 21a side of base 21. Thus, manufacture of semiconductor device evaluation jig 20 is facilitated and the manufacture cost is reduced.

Further, as shown in FIG. 1, temperature detecting element 22, electrode pad 23, interconnecting portion 25, and connection wire 26 are disposed within recess 21c. In addition, electrode pad 24 is disposed within recess 21d. Accordingly, no protrusion is present on front surface 21a of base 21. Therefore, there is no restriction on mounting of semiconductor device 30 on front surface 21a, the mounting thereof is facilitated, and the effect of shortening the duration of the process is expected.

Further, as shown in FIG. 1, temperature detecting element 22 is disposed on bottom 21ca of recess 21c. Accordingly, temperature detecting element 22 can be easily attached to base 21 by die bonding, for example.

Further, as shown in FIG. 2, a plurality of temperature detecting elements 22 are arranged in a line. Accordingly, regardless of the size of semiconductor device 30, the detection precision for the temperature of semiconductor device 30 to be evaluated can be maintained.

Further, as shown in FIG. 1, through hole 21e of base 21 has a smaller opening area S1 at front surface 21a and a larger opening area S2 at back surface 21b. At back surface 21b, opening area S2 of through hole 21e is made larger to facilitate positional alignment between through hole 21e and suction hole 1d of chuck stage 1. In addition, at front surface 21a, opening area S1 of through hole 21e is made smaller to easily prevent contact portion 2a of contact probe 2 and through hole 21e from being located at the same position, which suppresses breakage of semiconductor device 30.

Further, as shown in FIGS. 1 and 2, temperature detecting element 22 is connected through connection wire 26 to interconnection 25b of interconnecting portion 25 where electrode pad 23 is formed. Accordingly, it is easy to place electrode pad 23 away from temperature detecting element 22. It is therefore also easy to place electrode pad 23 away from semiconductor device 30 as seen in plan view, which improves the degree of freedom of the position where electrode pad 23 is placed.

Further, as shown in FIG. 1, temperature detecting element 22 is located directly below mount region R2 or R3. Accordingly, temperature detecting element 22 can be located closer to semiconductor device 30, which improves the precision with which the temperature is detected.

Further, in the case where base member 25a is made of a ceramic material, the ceramic material having high thermal conductivity does not function as a thermal resistor, which suppresses variation of the temperature to be evaluated.

Further, in the case where base member 25a is made of a resin, base member 25a which is of low cost and has a high degree of freedom in shape can be easily manufactured.

Further, in the case where base member 25a is formed of a flexible substrate, base member 25a having a thin thickness and a high degree of freedom in shape can be easily manufactured.

Further, electrode pad 23 as seen in plan view as shown in FIG. 2 is located at a shorter distance from the edge of front surface 21a of base 21, relative to the distance from the edge to temperature detecting element 22. Accordingly, contact probe 2 which contacts electrode pad 23 can be located away from semiconductor device 30. Discharge between contact probe 2 contacting electrode pad 23 and semiconductor device 30 or another contact probe 2 can thus be suppressed.

Further, electrode pad 24 as seen in plan view as shown in FIG. 2 is located at the opposite edge of base 21 to the edge where electrode pad 23 is located, with through hole 21e interposed between electrode pads 23 and 24. Accordingly, contact probe 2 which contacts electrode pad 24 can be located away from contact probe 2 which contacts electrode pad 23, and discharge between these contact probes 2 can be suppressed.

Further, in accordance with a semiconductor device evaluation method in the present embodiment, a plurality of contact probes 2 can be electrically connected to respective corresponding electrode pads 23, 24 and surface pads of semiconductor device 30. Accordingly, all electrical connections with contact probes 2 can be accomplished in the front surface 21a side of base 21, which facilitates electrical evaluation of semiconductor device 30.

Second Embodiment

Figure 7:
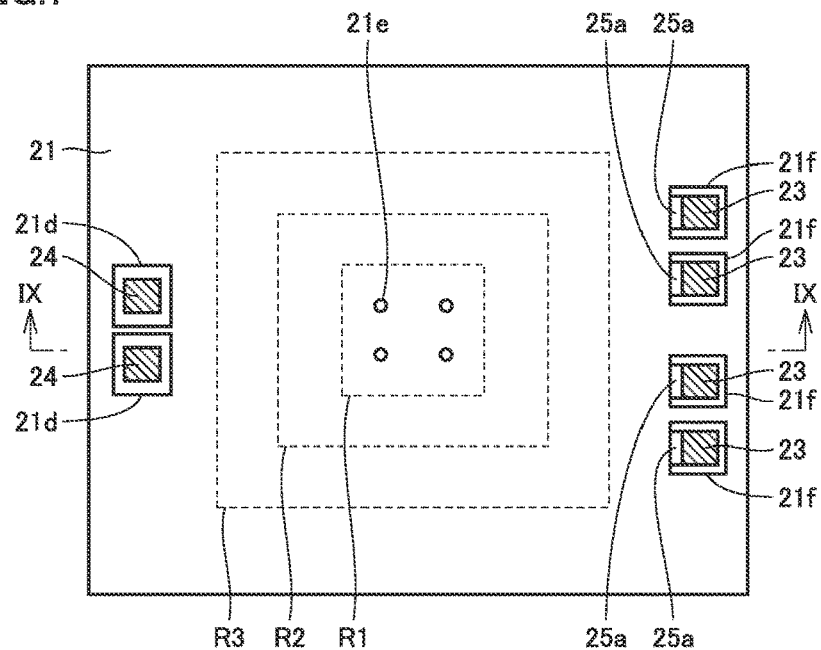
FIG. 7 is a plan view schematically showing a configuration of a semiconductor device evaluation jig in a second embodiment of the present invention.
Figure 8:
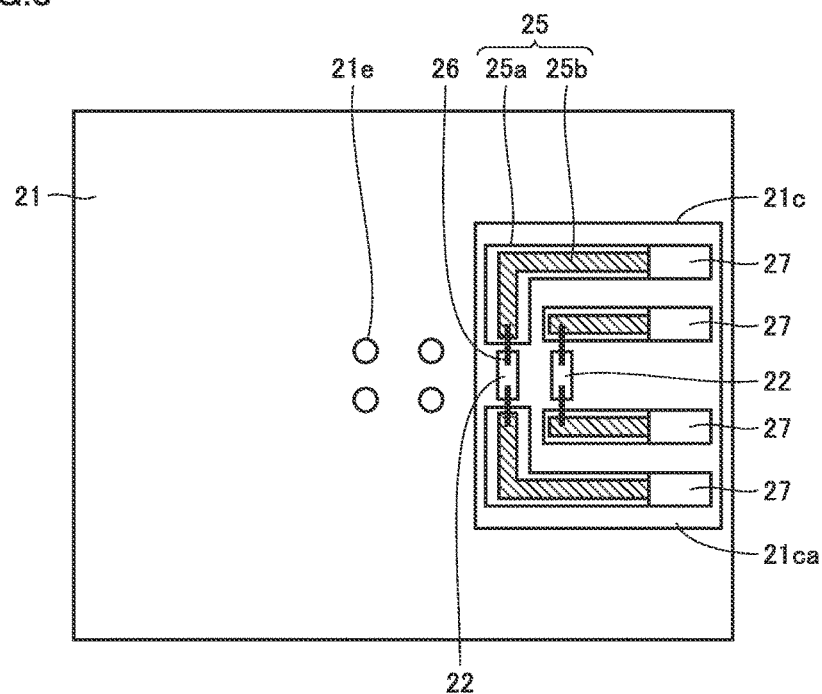
FIG. 8 is a rear view schematically showing the configuration of the semiconductor device evaluation jig in the second embodiment of the present invention.
Figure 9:
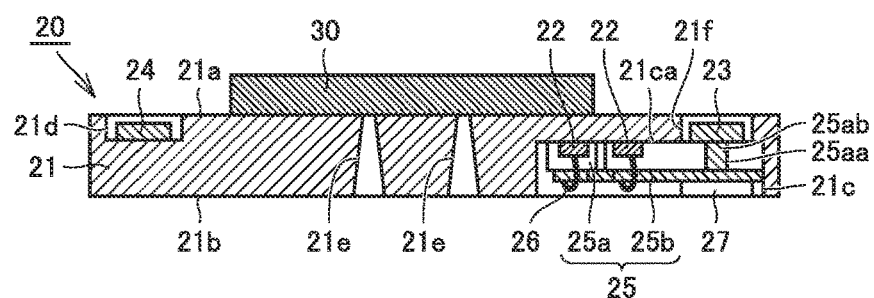
FIG. 9 is a schematic cross-sectional view of the semiconductor device evaluation jig and a semiconductor device along line IX-IX in FIG. 7.

FIGS. 7 and 8 are respectively a plan view and a rear view schematically showing a configuration of a semiconductor device evaluation jig in the present embodiment. FIG. 9 is a schematic cross-sectional view of the semiconductor device evaluation jig and a semiconductor device along line IX-IX in FIG. 7.

As shown in FIGS. 7 to 9, the configuration in the present embodiment differs from the configuration in the first embodiment in that temperature detecting element 22, electrode pad 23, interconnecting portion 25, and connection wire 26 are located in the back surface 21b side of base 21 and attached to base 21 in the present embodiment.

As shown mainly in FIGS. 8 and 9, recess 21c in the present embodiment is formed in back surface 21b of base 21, rather than front surface 21a of base 21. In recess 21c, temperature detecting element 22, interconnecting portion 25, and connection wire 26 are disposed.

Temperature detecting element 22 is attached to base 21 by die bonding for example to bottom 21ca of recess 21c. Base member 25a of interconnecting portion 25 is attached, by adhesion or the like, to bottom 21ca of recess 21c. On the lower surface of base member 25a, interconnection 25b is formed. Interconnection 25b is electrically connected to temperature detecting element 22 by connection wire 26.

As shown mainly in FIGS. 7 and 9, base 21 has a hole 21f extending from bottom 21ca of recess 21c to reach front surface 21a. At front surface 21a of base 21, electrode pad 23 is exposed through hole 21f. Electrode pad 23 is formed on the upper surface of base member 25a. Electrode pad 23 is electrically connected to interconnection 25b by an electrically conductive layer 25ab filling a through hole 25aa extending through base member 25a.

As shown mainly in FIGS. 8 and 9, a reinforcement member 27 is disposed directly below electrode pad 23 and under interconnection 25b. Reinforcement member 27 is made of a non-electrically-conductive material such as resin material for example.

Features of the present embodiment other than the above-described ones are substantially identical to those of the first embodiment. Therefore, the same elements are denoted by the same reference characters, and the description thereof will not be repeated.

In accordance with the present embodiment, temperature detecting element 22 is disposed in the back surface 21b side of base 21. The distance from temperature detecting element 22 to semiconductor device 30 through base 21 is therefore shorter than that of the first embodiment. Accordingly, the precision with which the temperature of semiconductor device 30 is detected can be improved.

Further, as shown in FIG. 9, temperature detecting element 22, interconnecting portion 25, and connection wire 26 are disposed within recess 21c. In addition, electrode pad 23 is disposed within hole 21f and electrode pad 24 is disposed within recess 21d. Accordingly, no protrusion is present on front surface 21a of base 21. Therefore, there is no restriction on mounting of semiconductor device 30 on front surface 21a, the mounting thereof is facilitated, and the effect of shortening the duration of the process is expected.

Further, reinforcement member 27 is provided, which suppresses flexure of interconnecting portion 25 when contact probe 2 is in contact with electrode pad 23.

Further, all the pads contacting contact probe 2 (electrode pads 23, 24 and surface pads) are located in the same surface side. The evaluation process is thus facilitated and the configuration of semiconductor device evaluation apparatus 10 can be simplified.

Third Embodiment

Figure 10:
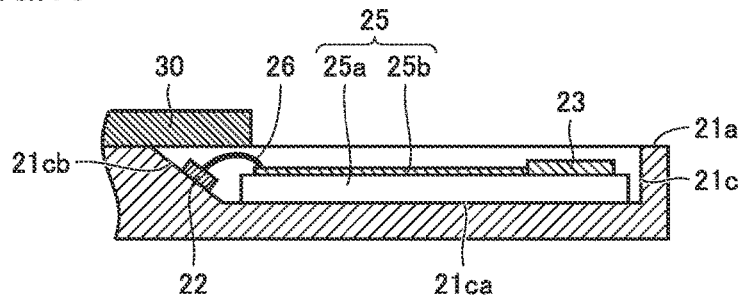
FIG. 10 is a partial cross-sectional view schematically showing a configuration of a semiconductor device evaluation jig and a semiconductor device in a third embodiment of the present invention.

FIG. 10 is a partial cross-sectional view schematically showing a configuration of a semiconductor device evaluation jig and a semiconductor device in the present embodiment. As shown in FIG. 10, the configuration in the present embodiment differs from the configuration in the first embodiment in that a side surface 21cb of recess 21c is inclined and temperature detecting element 22 is attached to the inclined side surface 21cb in the present embodiment.

Side surface 21cb is inclined with respect to front surface 21a of base 21 and forms an obtuse angle with bottom 21ca of recess 21c. Side surface 21cb formed as an inclined surface is a side surface within mount regions R2, R3 (namely the side surface located directly below semiconductor device 30 when semiconductor device 30 is mounted).

Features of the present embodiment other than the above-described ones are substantially identical to those of the first embodiment. Therefore, the same elements are denoted by the same reference characters, and the description thereof will not be repeated.

In accordance with the present embodiment, temperature detecting element 22 is disposed on inclined side surface 21cb. Therefore, the distance from temperature detecting element 22 to semiconductor device 30 through base 21 is shorter than that of the first embodiment. Accordingly, the precision with which the temperature of semiconductor device 30 is detected can be improved.

While the above description is of the case where side surface 21cb of recess 21c in the configuration of the first embodiment is inclined, the side surface of recess 21c in the second embodiment may be inclined as well and the temperature detecting element may be disposed on this inclined side surface.

Fourth Embodiment

Figure 11:
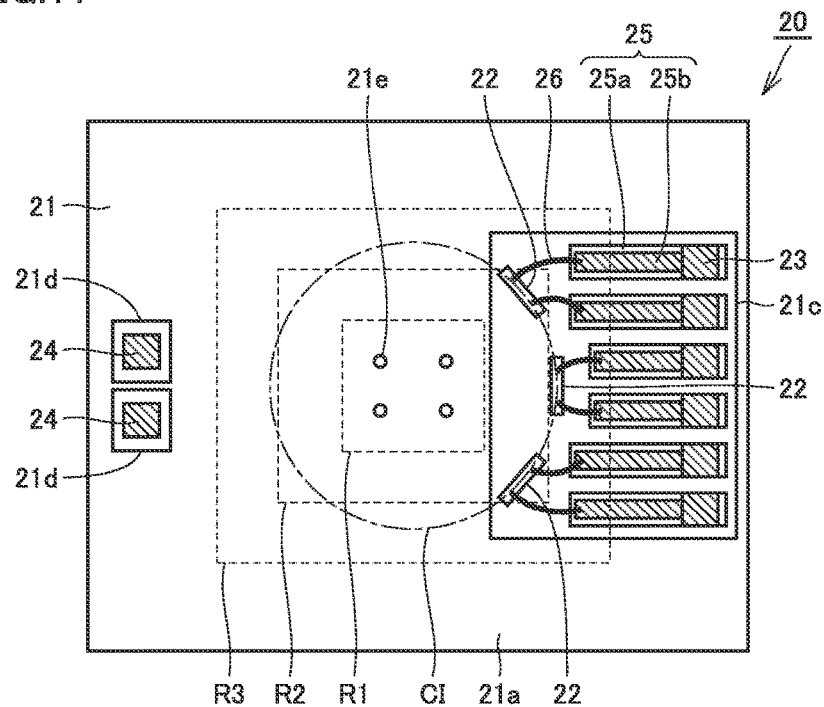
FIG. 11 is a plan view schematically showing a configuration of a semiconductor device evaluation jig in a fourth embodiment of the present invention.

FIG. 11 is a plan view schematically showing a configuration of a semiconductor device evaluation jig in the present embodiment. As shown in FIG. 11, the configuration in the present embodiment differs from the configuration in the first embodiment in that a plurality of temperature detecting elements 22 are arranged on the circumference of a circle CI of the imaginary line surrounding through holes 21e in the present embodiment.

Circle CI of the imaginary line is preferably a circle having its center at the center of base 21. On the circumference of circle CI of the imaginary line, a plurality of (three for example) temperature detecting elements 22 are arranged.

Features of the present embodiment other than the above-described ones are substantially identical to those of the first embodiment. Therefore, the same elements are denoted by the same reference characters, and the description thereof will not be repeated.

In accordance with the present embodiment, a plurality of temperature detecting elements 22 are arranged in the above-described manner, and therefore, a plurality of temperature detecting elements 22 can be arranged at respective positions along a part of the perimeter of semiconductor device 30. The distribution of the temperature along the perimeter of semiconductor device 30 is thus detected, which improves the precision with which the temperature distribution of semiconductor device 30 is detected.

While the above description is of the case where a plurality of temperature detecting elements 22 are arranged along the circumference of circle CI of the imaginary line in the configuration of the first embodiment, a plurality of temperature detecting elements 22 in the second embodiment may be arranged in a similar manner. In this case, the distance between temperature detecting elements 22 and semiconductor device 30 is further reduced, and therefore, the precision with which the temperature of semiconductor device 30 is detected can be improved.

Fifth Embodiment

Figure 12:
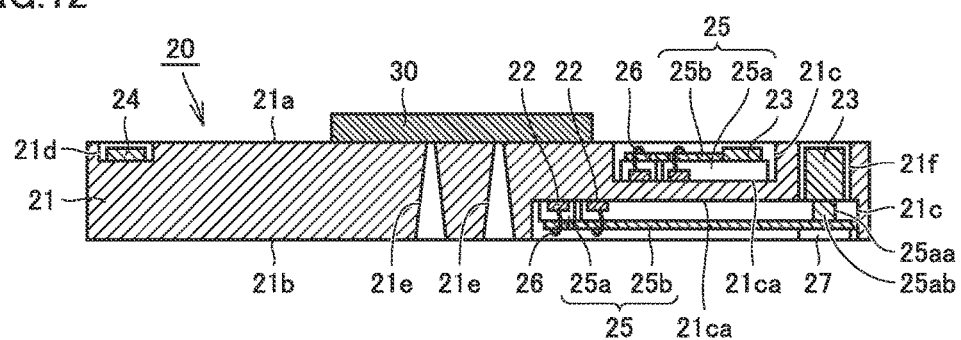
FIG. 12 is a cross-sectional view schematically showing a configuration of a semiconductor device evaluation jig and a semiconductor device in a fifth embodiment of the present invention.

FIG. 12 is a plan view schematically showing a configuration of a semiconductor device evaluation jig and a semiconductor device in the present embodiment. In the configuration of the present embodiment as shown in FIG. 12, recess 21c located in the front surface 21a side of base 21 and the configuration in this recess 21c in the first embodiment is combined with recess 21c located in the back surface 21b side of base 21 and the configuration in this recess 21c in the second embodiment.

Features of the present embodiment other than the above-described ones are substantially identical to those of the first and second embodiments. Therefore, the same elements are denoted by the same reference characters, and the description thereof will not be repeated.

In this way, temperature detecting elements 22 are disposed in both front surface 21a and back surface 21b of base 21, which enables further details of the temperature distribution of semiconductor device 30 to be recognized.

While the above description of the embodiments is applied to the case where one semiconductor device 30 is mounted on one semiconductor device evaluation jig 20, the number of semiconductor devices 30 mounted on one semiconductor device evaluation jig 20 may be more than one.

Moreover, the above-described first to fourth embodiments may be combined as appropriate.

It should be construed that the embodiments disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST 1 chuck stage; 1a, 21a, 30la surface; 1b suction groove; 1c, 1d suction hole; 2 contact probe; 2a contact portion; 2b tip portion; 2c pushed-in portion; 2d insulating base mount portion; 2e electrically-connecting portion; 3 insulating base; 4 connecting portion; 5 signal line; 6 evaluation unit; 7 moving arm; 8 probe base; 10 semiconductor device evaluation apparatus; 20 semiconductor device evaluation jig; 21 base; 21b rear surface; 21c recess; 21ca bottom; 21cb side surface; 21e through hole; 21f hole; 22 temperature detecting element; 22a single crystal silicon layer; 22b insulating layer; 22c n-type polycrystalline silicon layer; 22d p-type polycrystalline silicon layer; 22e, 23, 24 electrode pad; 22f metal electrode; 25 interconnecting portion; 25a base member; 25ab conductive layer; 25b interconnection; 26 connection wire; 27 reinforcement member; 30 semiconductor device; 30a $p^+$ collector region; 30b $n^+$ region; 30c $n^-$ region; 30d p-type base region; 30e $n^+$ emitter region; 30f $p^+$ contact region; 30g gate insulating layer; 30h gate electrode layer; 30i interlayer insulating layer; 30ia contact hole; 30j emitter electrode; 30k collector electrode; 30l semiconductor substrate; 30m surface pad

The invention claimed is:

1. A semiconductor device evaluation jig to be used with a semiconductor device evaluation apparatus for evaluating an electrical characteristic of a semiconductor device, the semiconductor device evaluation jig in use being disposed on a stage of the semiconductor device evaluation apparatus, the semiconductor device evaluation jig comprising:
a base having electrical conductivity and a plate shape,
the base having a first surface and a second surface opposite to the first surface,
the base having, in the first surface, a mount region where the semiconductor device is to be mounted, and
the base having a through hole located in the mount region and extending through from the first surface to the second surface;
at least one temperature detecting element attached to the base;
a first electrode pad electrically connected to the temperature detecting element and formed in the first surface side; and
a second electrode pad formed in the first surface side of the base and electrically connected to the base,
in the first surface, the base having a second electrode pad recess, and the second electrode pad being disposed in the second electrode pad recess.

2. The semiconductor device evaluation jig according to claim 1, wherein
the second electrode pad is disposed at an edge of the first surface of the base, and the edge is located opposite to the first electrode pad with respect to the through hole located between the second electrode pad and the first electrode pad.

3. The semiconductor device evaluation jig according to claim 1, wherein
in the first surface side, the temperature detecting element is attached to the base.

4. The semiconductor device evaluation jig according to claim 1, wherein
in the second surface side, the temperature detecting element is attached to the base.

5. The semiconductor device evaluation jig according to claim 1, wherein
the at least one temperature detecting element includes a first temperature detecting element and a second temperature detecting element, and
in the first surface side, the first temperature detecting element is attached to the base and, in the second surface side, the second temperature detecting element is attached to the base.

6. The semiconductor device evaluation jig according to claim 1, wherein
in at least one of the first surface and the second surface, the base has a first electrode pad recess, and the at least one temperature detecting element is disposed in the first electrode pad recess.

7. The semiconductor device evaluation jig according to claim 6, further comprising an interconnecting portion electrically connecting the temperature detecting element to the first electrode pad, wherein
the interconnecting portion is disposed in the first electrode pad recess.

8. The semiconductor device evaluation jig according to claim 7, wherein
the interconnecting portion includes a base member attached to the base and an interconnection attached to the base member, and
the base member is made of a ceramic material.

9. The semiconductor device evaluation jig according to claim 7, wherein
the interconnecting portion includes a base member attached to the base and an interconnection attached to the base member, and
the base member is made of a resin.

10. The semiconductor device evaluation jig according to claim 6, wherein
the first electrode pad recess is formed in the second surface, and the base has a hole extending from a bottom of the first electrode pad recess to reach the first surface, and
from the first surface, the first electrode pad is exposed through the hole.

11. The semiconductor device evaluation jig according to claim 6, wherein
at least one wall surface of the first electrode pad recess is an inclined surface which is inclined with respect to the first surface, and the temperature detecting element is attached to the inclined surface.

12. The semiconductor device evaluation jig according to claim 6, wherein
the temperature detecting element is disposed on a bottom of the first electrode pad recess.

13. The semiconductor device evaluation jig according to claim 1, wherein
the at least one temperature detecting element includes a plurality of temperature detecting elements, and
the plurality of temperature detecting elements are arranged in a line.

14. The semiconductor device evaluation jig according to claim 1, wherein
the at least one temperature detecting element includes a plurality of temperature detecting elements, and
the plurality of temperature detecting elements are arranged on a circumference of a circle surrounding the through hole.

15. The semiconductor device evaluation jig according to claim 1, wherein
the through hole has a tapered shape with an opening area of the through hole at the second surface larger than an opening area of the through hole at the first surface.

16. The semiconductor device evaluation jig according to claim 1, wherein
the temperature detecting element is disposed directly below the mount region.

17. The semiconductor device evaluation jig according to claim 1, wherein
the first electrode pad is located at a shorter distance from an edge of the first surface of the base relative to a distance from the edge to the temperature detecting element.

18. The semiconductor device evaluation jig according to claim 1, wherein
the temperature detecting element is a diode.

19. A semiconductor device evaluation apparatus comprising:
the semiconductor device evaluation jig as recited in claim 1;
the stage on which the semiconductor device evaluation jig is to be mounted;
a first probe connected to a surface pad of the semiconductor device and a second probe connected to the first electrode pad; and
an evaluation unit electrically connected to the first probe and the second probe and configured to evaluate an electrical characteristic and a temperature of the semiconductor device.

20. A semiconductor device evaluation method using the semiconductor device evaluation apparatus as recited in claim 19, the method comprising:
mounting the semiconductor device evaluation jig on the stage;
mounting the semiconductor device on the semiconductor device evaluation jig; and
electrically connecting the first probe to the surface pad of the semiconductor device, electrically connecting the second probe to the first electrode pad, and evaluating an electrical characteristic of the semiconductor device.

* * * * *